(12) United States Patent
Thakur et al.

(10) Patent No.: US 6,392,284 B1
(45) Date of Patent: May 21, 2002

(54) CAPACITOR/ANTIFUSE STRUCTURE HAVING A BARRIER-LAYER ELECTRODE AND IMPROVED BARRIER LAYER

(75) Inventors: Randhir P. S. Thakur, Boise, CA (US); Garry A. Mercaldi; Michael Nuttall, both of Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/353,576

(22) Filed: Jul. 15, 1999

Related U.S. Application Data

(62) Division of application No. 09/032,182, filed on Feb. 27, 1998, now Pat. No. 6,150,706.

(51) Int. Cl.[7] .............................................. H01L 29/00
(52) U.S. Cl. ...................... 257/530; 257/529; 257/209
(58) Field of Search ............................ 257/529, 530, 257/209; 438/128, 129, 131, 467, 500

(56) References Cited

U.S. PATENT DOCUMENTS

| | | | |
|---|---|---|---|
| 4,211,941 A | 7/1980 | Schade, Jr. ................. 307/303 |
| 4,419,743 A | 12/1983 | Taguchi et al. ............. 365/149 |
| 4,551,906 A | 11/1985 | Ogura et al. ................. 29/571 |
| 4,748,490 A | * 5/1988 | Hollingsworth ............. 357/51 |
| 4,782,032 A | 11/1988 | Geissberger et al. .......... 437/41 |
| 5,070,384 A | 12/1991 | McCollum et al. ........... 357/51 |
| 5,227,323 A | 7/1993 | Nishitsuji et al. ............ 437/47 |
| 5,229,323 A | 7/1993 | Shimada et al. ............ 437/176 |
| 5,362,632 A | 11/1994 | Mathews ..................... 437/47 |
| 5,486,488 A | 1/1996 | Kamiyama ................... 437/60 |
| 5,521,440 A | 5/1996 | Iranmanesh ................. 257/774 |
| 5,561,307 A | 10/1996 | Mihara et al. .............. 257/295 |
| 5,567,647 A | 10/1996 | Takahashi ................... 437/177 |
| 5,587,613 A | 12/1996 | Iranmanesh ................. 257/530 |
| 5,597,754 A | 1/1997 | Lou et al. ..................... 437/52 |
| 5,608,249 A | 3/1997 | Gonzalez ..................... 257/306 |
| 5,622,893 A | 4/1997 | Summerfelt et al. ......... 438/396 |
| 5,627,395 A | 5/1997 | Witek et al. ................. 257/350 |
| 5,652,165 A | 7/1997 | Lu et al. ....................... 437/52 |
| 5,699,291 A | 12/1997 | Tsunemine .................. 365/149 |
| 5,728,616 A | 3/1998 | Sakao ......................... 438/240 |
| 5,770,500 A | 6/1998 | Batra et al. ................. 438/255 |
| 5,786,259 A | 7/1998 | Kang .......................... 438/396 |
| 5,801,098 A | 9/1998 | Fiordalice et al. .......... 438/653 |
| 5,804,479 A | 9/1998 | Aoki et al. .................. 438/253 |
| 5,814,852 A | 9/1998 | Sandhu et al. .............. 257/310 |
| 5,827,766 A | 10/1998 | Lou ............................ 438/253 |
| 5,837,593 A | 11/1998 | Park et al. .................. 438/396 |
| 5,847,424 A | 12/1998 | Kang .......................... 257/306 |
| 5,854,734 A | 12/1998 | Sandhu et al. ........... 361/321.5 |
| 5,877,062 A | 3/1999 | Horii .......................... 438/396 |
| 5,877,978 A | 3/1999 | Morishita et al. ........... 365/149 |
| 5,903,023 A | 5/1999 | Hoshi .......................... 257/300 |

(List continued on next page.)

FOREIGN PATENT DOCUMENTS

EP  2 279 588 A2  8/1988

OTHER PUBLICATIONS

P.M. Smith and J.S. Custer, "Chemical Vapor Deposition of Titanium–Silicon–Nitride–Films," *Applied Physics Letter*, 70(23):3116–3118, Jun. 1997.

Primary Examiner—Eddie Lee
Assistant Examiner—N. Drew Richards
(74) *Attorney, Agent, or Firm*—Dorsey & Whitney LLP

(57) ABSTRACT

A semiconductor structure includes a dielectric layer having first and second opposing sides. A conductive layer is adjacent to the first side of the dielectric layer and is coupled to a first terminal, and a conductive barrier layer is adjacent to the second side of the dielectric layer and is coupled to a second terminal. The conductive barrier layer may be formed from tungsten nitride, tungsten silicon nitride, titanium silicon nitride or other barrier materials.

23 Claims, 4 Drawing Sheets

U.S. PATENT DOCUMENTS

| | | | |
|---|---|---|---|
| 5,905,283 A | 5/1999 | Kasai | 257/334 |
| 5,909,043 A | 6/1999 | Summerfelt | 257/298 |
| 5,930,106 A | 7/1999 | Deboer et al. | 361/305 |
| 5,969,983 A | 10/1999 | Thakur et al. | 365/149 |
| 5,970,309 A | 10/1999 | Ha et al. | 438/3 |
| 5,976,928 A | 11/1999 | Kirlin et al. | 438/240 |
| 5,977,583 A | 11/1999 | Hosotani et al. | 257/311 |
| 5,994,183 A | 11/1999 | Huang et al. | 438/256 |
| 5,998,826 A | 12/1999 | Hung et al. | 257/315 |
| 6,010,931 A | 1/2000 | Sun et al. | 438/240 |
| 6,015,743 A | 1/2000 | Zhaurak et al. | 438/398 |
| 6,114,200 A | 9/2000 | Yew et al. | 438/253 |
| 6,130,482 A * | 10/2000 | Iio et al. | 257/774 |
| 6,150,208 A | 11/2000 | Deboer et al. | 438/240 |
| 6,150,705 A | 11/2000 | Chen | 257/530 |
| 6,171,925 B1 | 1/2001 | Graettinger et al. | 438/396 |
| 6,204,069 B1 | 3/2001 | Summerfelt et al. | 438/3 |
| 6,207,222 B1 | 3/2001 | Chen et al. | 427/97 |
| 6,225,157 B1 | 5/2001 | Thakur et al. | 438/240 |

* cited by examiner

TO ACCESS DEVICE
(FIG.3)

TO ACCESS DEVICE
(FIG.3)

CAPACITOR/ANTIFUSE STRUCTURE HAVING A BARRIER-LAYER ELECTRODE AND IMPROVED BARRIER LAYER

CROSS-REFERENCE TO RELATED APPLICATION

This application is a divisional of pending U.S. patent application Ser. No. 09/032,182, filed Feb. 27, 1998, now U.S. Pat. No. 6,150,706.

TECHNICAL FIELD

The invention relates generally to integrated circuits and more specifically to an integrated circuit capacitor having a barrier layer that forms at least a portion of at least one of the capacitor electrodes, and to an improved barrier layer.

BACKGROUND OF THE INVENTION

To increase storage density (the ratio of storage capacity to die size) and data-access speed, dynamic-random-access-memory (DRAM) manufacturers continue to reduce the geometries of and otherwise improve the structures and components that compose a DRAM circuit. One such component is the capacitor that is used as the storage element of a DRAM cell and one such structure is a diffusion barrier layer. Another such component is an antifuse, which often has a structure that is similar or identical to that of a capacitor.

Unfortunately, leakage and depletion often prevent DRAM manufacturers from shrinking the size of a DRAM-cell capacitor from its present size. Generally, leakage denotes the discharge current that flows through the capacitor dielectric when the capacitor is open-circuited, and thus is a measure of how fast the charge on a capacitor will leak away. In a capacitor with semiconductor electrodes, e.g., polysilicon, depletion denotes the affect of the depletion regions that form within these electrodes when the capacitor stores a charge. As the amount of leakage or depletion increases, the capacitor's storage capacity decreases. But unfortunately, the storage capacity of a DRAM capacitor can be reduced only so much before the DRAM cell can no longer hold its state between refresh cycles, and thus can no longer store data reliably. Therefore, because the storage capacity of a capacitor is proportional to the area of the capacitor plates, the area, and thus the overall size, of a DRAM capacitor often must be relatively large to compensate for the storage-capacity-robbing affects of leakage and depletion. That is, the DRAM capacitor often must be larger than it would have to be if leakage or depletion were reduced or eliminated.

Furthermore, conventional electrode material, such as polysilicon, often causes the access speed of a DRAM cell to be relatively slow. Often, the resistance of an electrode formed from such a material is relatively high. Therefore, because this resistance is effectively in series with the DRAM capacitor, it causes the time constant for charging/discharging the capacitor to be relatively large, and thus causes the DRAM cell to have a relatively long read/write time.

Additionally, conventional barrier materials often prevent manufacturers from reducing the dimensions of a structure disposed in a barrier layer. A barrier layer is often used to prevent the dopant in one layer from diffusing into an adjacent layer during circuit processing. A popular barrier material is tungsten silicide. But unfortunately, tungsten silicide crystallizes at about 800° C. and forms relatively large grains. This crystallization degrades tungsten silicide's barrier properties by orders of magnitude because dopants can easily diffuse along the grain boundaries. The large grains also prevent the use of tungsten silicide with relatively narrow structures such as wordlines. That is, if the structure's width is about the same as or is less than the grain size, tungsten silicide often cannot be used. Furthermore, although it can sometimes be used as such a barrier layer, titanium nitride oxidizes easily, and thus is unsuitable for use in many applications.

Moreover, conventional electrode materials may cause a circuit coupled to an antifuse to have a relatively slow access speed. An antifuse has a structure similar to that of a capacitor, but is typically used as a one-time programmable, nonvolatile storage element. For example, an antifuse can be "blown" into a short-circuited state by applying a programming voltage that is high enough to break down the dielectric such that the electrodes contact each other through the dielectric. Unfortunately, the relatively high resistance of conventional electrode materials may cause a blown antifuse to have a relatively high resistance. Because the circuit coupled to the antifuse often has a parasitic capacitance associated therewith, the relatively large time constant of the coupled antifuse electrodes and parasitic capacitance can cause the circuit to have a relatively slow access speed.

SUMMARY OF THE INVENTION

In accordance with one aspect of the invention, a semiconductor structure includes a dielectric layer having first and second opposing sides, a conductive layer that is adjacent to the first side of the dielectric layer, and a conductive barrier layer that is adjacent to the second side of the dielectric layer. A first terminal of the semiconductor structure is coupled to the conductive layer and a second terminal of the semiconductor structure is coupled to the barrier layer.

When used as a capacitor, such a structure exhibits reduced leakage, depletion, thickness, and resistance as compared with a conventional capacitor, and thus can be made significantly smaller than a conventional capacitor. Furthermore, such a capacitor exhibits a reduced time constant as compared with a conventional capacitor. Thus, when used in a DRAM cell, such a capacitor can increase the access speed of the DRAM cell as compared with a conventional cell. Moreover, when used as an antifuse, such a structure can increase the access speed of a circuit coupled thereto as compared with a conventional antifuse.

DETAILED DESCRIPTION OF THE INVENTION

Figure 1:
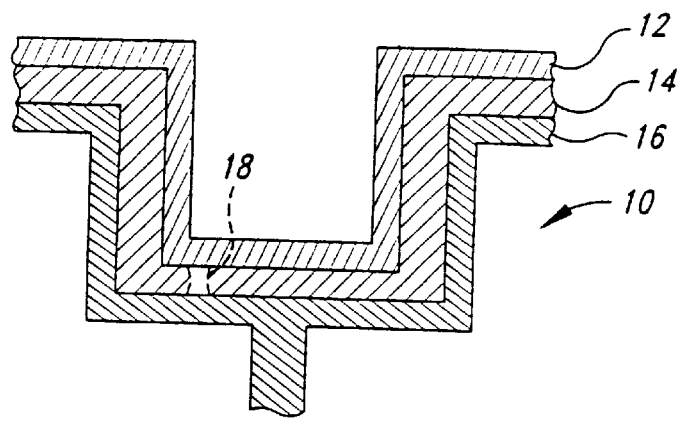
FIG. 1 is a cross-sectional view of a capacitor according to one embodiment of the invention.

FIG. 1 is a cross-sectional view of a DRAM capacitor 10 according to one embodiment of the invention. The capacitor 10 includes a conventional electrode 12, which is formed from a conductive material such as polysilicon. The electrode 12 is adjacent to one side of a conventional dielectric 14, which is formed from an insulator such as silicon dioxide, barium strontium titanate, or tantalum pentaoxide. Another electrode 16 is adjacent to another side of the dielectric 14, and is coupled to a DRAM-cell access device, such as a transistor. The electrode 16 is formed from a barrier material, and thus may be called a barrier electrode. The barrier electrode 16 may include conventional barrier materials, such as titanium nitride, or may include tungsten nitride, tungsten silicon nitride, or titanium silicon nitride, which are discussed below in conjunction with FIG. 3. Furthermore, although described for use in a DRAM cell, the capacitor 10 can be used for other applications and in other integrated circuits such as microprocessors.

The barrier electrode 16 allows the capacitor 10 to be significantly smaller than a conventional capacitor. For example, due to its relatively high work function, the barrier electrode 16 increases the height of the barrier to electron flow through the dielectric 14, and thus reduces the leakage of the capacitor 10. Furthermore, because the barrier electrode 16 is not a semiconductor material like polysilicon, there is no depletion in the electrode 16. Therefore, the overall depletion associated with the capacitor 10 is significantly reduced. Also, in one embodiment, the barrier electrode 16 is thinner than a conventional electrode such as the electrode 12. For example, a conventional polysilicon electrode such as the electrode 12 may be 600 Å thick, but the barrier layer 16 may be as thin as 10 to 100 Å. Additionally, the barrier electrode 16 has a significantly lower resistance than conventional electrodes such as the electrode 12, and thus reduces the series resistance of the capacitor 10. This also reduces the time constant associated with the capacitor 10, and thus increases the access speed of the DRAM cell that includes the capacitor 10. Moreover, the barrier electrode 16 also prevents dopants from diffusing from another layer into the dielectric 14, and prevents dopants in the dielectric 14 from diffusing out into other layers.

In another embodiment of the capacitor 10, the electrode 12 can be formed from silicon germanium, which has a higher work function than polysilicon. Thus, such an electrode 12 presents a higher barrier to the electron flow through the dielectric 14 than does polysilicon, and thus further reduces the leakage of the capacitor 10.

In still another embodiment, the electrodes 12 and 16 can be reversed. That is, the electrode 16 can be formed from a conventional electrode material such as polysilicon or from silicon germanium as discussed above, and the electrode 12 can be the barrier electrode. Alternatively, both the electrodes 12 and 16 can be barrier electrodes made from the same or different barrier materials. In such an embodiment, the leakage and thickness of the capacitor 10 are further reduced, and the depletion is virtually eliminated.

Furthermore, although shown having planar sides in FIG. 1 for clarity, in an embodiment where the electrode 12 is a barrier electrode, the electrode 16 may be formed with a rough or bumpy surface to increase its surface area. One conventional material that is suitable to form such a rough electrode 16 is hemispherical silicon grain (HSG) polysilicon. Also, the dielectric 14 and electrode 12 are formed such that they conform to the adjacent rough surface of the electrode 16, and thus also have increased surface areas. Therefore, the increased surface areas of the electrodes 12 and 13 and the dielectric 14 increase the capacitance of the capacitor 10.

In yet another embodiment, the capacitor 10 can be used as an antifuse. As previously discussed, an antifuse is a programmable, nonvolatile, device that is normally electrically open but can be programmed to become electrically closed, i.e., a short circuit. For example, referring to the capacitor 10, to form one or more short circuits 18, a sufficient voltage is applied across the electrodes 12 and 16 so as to cause the dielectric 14 to break down and the short circuit 18 to develop between the electrodes 12 and 16. Because the electrode 16 is a barrier electrode, the series resistance of such an antifuse is significantly reduced as is the time constant associated with the antifuse. Therefore, circuitry coupled to the antifuse can operate at a higher speed than with a conventional, higher-resistance antifuse.

Figure 2:
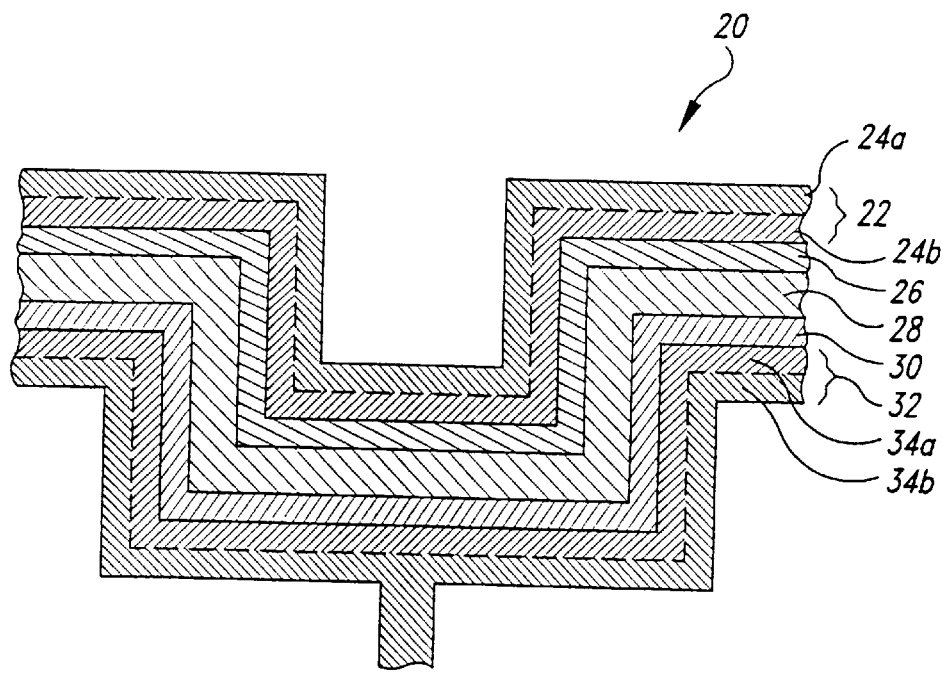
FIG. 2 is a cross-sectional view of a capacitor according to another embodiment of the invention.

FIG. 2 is a cross-sectional view of a DRAM capacitor 20 according to another embodiment of the invention. The capacitor 20 includes a first electrode 22, which may be one continuous layer or may include separate layers 24a and 24b. A first barrier layer 26 is disposed adjacent to one side of the electrode 22, a conventional dielectric 28 is disposed adjacent to an opposite side of the barrier layer 26, a second barrier layer 30 is disposed adjacent to another side of the dielectric 26, and a second electrode 32 is adjacent to an opposite side of the barrier layer 30. Like the first electrode 22, the second electrode 32 may be one continuous layer or may include separate layers 34a and 34b. Furthermore, like the barrier electrode 16 of FIG. 1, the barrier layers 26 and 30 may be formed from conventional barrier materials such as a titanium nitride, or may be formed from tungsten nitride, tungsten silicon nitride, or titanium silicon nitride. The barrier layers 26 and 30, however, can be formed such that they do not form a silicide with the adjacent electrodes 22 and 32, respectively. Alternatively, one or both of the layers 24b and 34a may be silicide layers, or respective silicide layers may be disposed between the layers 24b and 34a and the dielectric 28. Additionally, although described as used in a DRAM, the capacitor 20 may be used in other applications as well.

As discussed above in conjunction with the barrier electrode 16 of FIG. 1, the barrier layers 26 and 30 reduce the leakage, depletion, series resistance, and thickness of the capacitor 20 as compared with conventional capacitors, and thus allow the capacitor 20 to be significantly smaller than conventional capacitors. For example, by increasing the barrier to electron flow through both sides of the dielectric 28, the barrier layers 26 and 30 significantly reduce the leakage of the capacitor 20. Furthermore, where one or both of the electrodes 22 and 32 are formed from polysilicon or another semiconductor material, the respective barrier layers 26 and 30 (having respective thicknesses as low as 10 to 100 Å in one embodiment) allow the respective thicknesses of the electrodes 22 and 32 to be reduced from approximately 600 Å (the typical thickness of a conventional semiconductor electrode as discussed above in conjunction with FIG. 1) to approximately 200 Å. Thus, not only does this reduction in thickness reduce the overall thickness of the capacitor 20, it also significantly reduces or eliminates the depletion that occurs in the electrodes 22 and 32. Additionally, by providing conductive paths along the sides of the semiconductor electrodes 22 and 32, respectively, the barrier layers 26 and 30 allow the charge carriers within the electrodes 22 and 32 to more easily travel from one location to another, and thus significantly reduce the series resistance of the capacitor 20.

In another embodiment, one or both of the electrodes 22 and 32 may be formed from silicon germanium, which, as discussed above in conjunction with the capacitor 10 of FIG. 1, further reduces the leakage of the capacitor 20. Alternatively, the layers 22 and 32 may each include a layer of silicon germanium and a layer of another conductive material such as polysilicon. That is, for example, one of the layers 24a and 24b may be formed from silicon germanium and the other layer 24a and 24b formed from a conductive material such as polysilicon. Likewise, one of the layers 34a and 34b may be formed from silicon germanium, and the other layer 34a and 34b formed from another conductive material such as polysilicon.

Also, as discussed above in conjunction with FIG. 1, although shown having planar edges for clarity, in one embodiment, one or both of the electrodes 22 and 32 are formed with rough edges to increase their respective surface areas, thus increasing the capacitance of the capacitor 20. For example, the electrode 22, the electrode 32, or both may be formed entirely from HSG polysilicon, or one of the layers 24a and 24b of the electrode 22 or one of the layers and 34a and 34b of the electrode 32 may be formed from HSG polysilicon, and the other one of the respective layers 24a and 24b, and 34a and 34b, may be formed from silicon germanium or another conductive material.

In yet another embodiment, the capacitor 20 can be used as an antifuse as discussed above for the capacitor 10 of FIG. 1.

Figure 3:
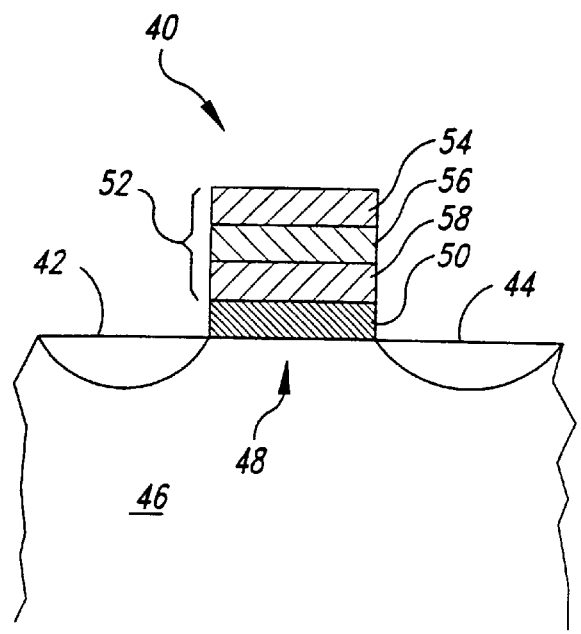
FIG. 3 is a cross-sectional view of a transistor having a gate structure that includes a barrier layer according to an embodiment of the invention.

FIG. 3 is a cross-sectional view of a transistor 40 according to another embodiment of the invention. The transistor 40 includes conventional source/drain regions 42 and 44, which are disposed in a substrate 46, a channel region 48, which is disposed in the substrate 46 between the source/drain regions 42 and 44, a conventional gate insulator 50, and a gate conductor 52, which includes a first conductive layer 54, a conductive barrier layer 56, and a second conductive layer 58. In one embodiment, the conductive layers 54 and 58 are formed from conventional materials. For example, the layer 54 may be a silicide layer and the layer 58 may be a polysilicon layer.

The barrier layer 56 prevents a dopant from diffusing from the layer 54, through the layer 58, and into the layer 50 during processing of the transistor 40. Where the layer 58 is a semiconductor material such as polysilicon, such diffusion can degrade the gate oxide 50 by causing mobile trapped charges that change the characteristics of the transistor 40, such as the threshold, and thus cause the transistor 40 to operate improperly for its intended use.

Because, as discussed above, conventional barrier materials such as tungsten silicide and titanium nitride are often not suited for the smaller geometries of today's denser integrated circuits, the barrier layer 56 is formed from tungsten nitride, tungsten silicon nitride, or titanium silicon nitride. These materials provide many advantages over conventional barrier materials. For example, the silicon component of tungsten silicon nitride and titanium silicon nitride allows transistor formation using a conventional "no spacer" process flow, which includes fewer steps and thus is cheaper to implement than other types of process flows. Furthermore, the silicon component of tungsten silicon nitride and titanium silicon nitride also increases the step coverage of these barrier materials as published by P. M. Smith et al., *Chemical Vapor Deposition of Titanium-Silicon-Nitride Films,* Applied Physics Letter 70 (23), American Institute of Physics, Jun. 9, 1997, pp. 3116–118. Although important at any geometry, step coverage becomes more important as the geometries shrink in size. Additionally, tungsten nitride, tungsten silicon nitride, and titanium silicon nitride are more compatible with conventional polysilicon electrodes, word lines, and interconnects than are tungsten silicide and titanium nitride. Moreover, because tungsten nitride, tungsten silicon nitride, and titanium silicon nitride have relatively high crystallization temperatures, they retain their barrier properties even after thermal cycling.

Figure 4:
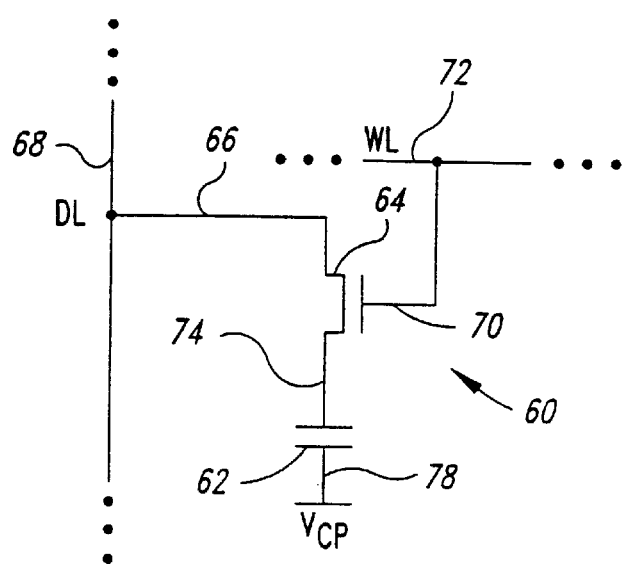
FIG. 4 is a schematic diagram of a DRAM cell that uses the capacitor of FIG. 1 or FIG. 2 or the transistor of FIG. 3.

FIG. 4 is a schematic diagram of a conventional DRAM cell 60, which includes a capacitor 62 and an access transistor 64. In one embodiment, the capacitor 42 has the same structure as either the capacitor 10 of FIG. 1 or the capacitor 20 of FIG. 2 and the transistor 64 is conventional. In another embodiment, the capacitor 62 is conventional and the transistor 64 has the same structure as the transistor 40 of FIG. 3. In yet another embodiment, the capacitor 42 has the same structure as either the capacitor 10 of FIG. 1 or the capacitor 20 of FIG. 2, and the transistor 64 has the same structure as the transistor 40 of FIG. 3. The access transistor 64 has an access terminal 66 coupled to a digit line 68, a gate 70 coupled to a word line 72, and a storage terminal 74 coupled to a data terminal 76 of the capacitor 62. A reference terminal 78 of the capacitor 42 is coupled to a conventional cell plate (not shown) that is biased at a cell-plate voltage $V_{CP}$. In one embodiment, the capacitor plate that composes the reference terminal 78 is actually integral with the cell plate. That is, the cell plate acts as the respective terminals/plates 78 for all of the capacitors 62 coupled thereto. Typically, $V_{CP}$ is half of the supply voltage that powers a circuit that includes the cell 60.

Figure 5:
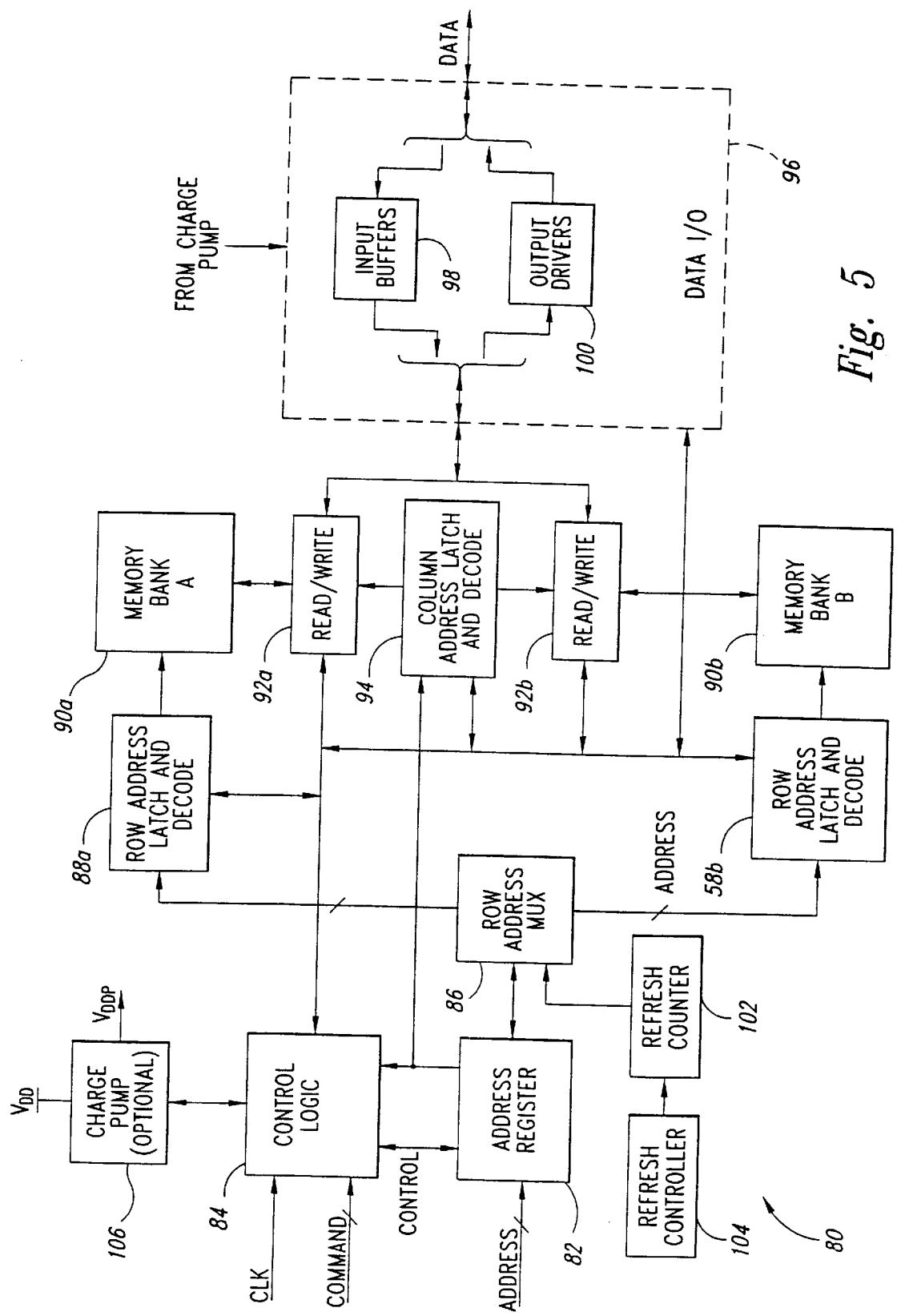
FIG. 5 is a block diagram of a memory circuit that can incorporate the capacitors of FIGS. 1 and 2, the transistor of FIG. 3, or the DRAM cell of FIG. 4.

FIG. 5 is a block diagram of a memory circuit 80, which can include the capacitor 10 or the capacitor 20 of FIGS. 1 and 2, respectively, the transistor 40 of FIG. 3, the DRAM cell 60 of FIG. 4, or a combination or subcombination of these components.

The memory circuit 80 includes an address register 82, which receives an address from an ADDRESS bus. A control logic circuit 84 receives a clock (CLK) signal, and receives clock enable (CKE), chip select ($\overline{CS}$), row address strobe ($\overline{RAS}$), column address strobe ($\overline{CAS}$), and write enable ($\overline{WE}$) signals from a COMMAND bus, and generates control signals for controlling the operation of the memory device 80. A row address multiplexer 86 receives the address signal from the address register 82 and provides the row address to row-address latch-and-decode circuits 88a and 88b for one of two memory banks 90a and 90b, respectively. The memory banks 90a and 90b each include a large number of DRAM cells 60 (FIG. 4) using one or more of several embodiments of the invention, as explained above. During read and write cycles, the row-address latch-and-decode circuits 88a and 88b activate the word lines of the addressed rows of memory cells in the memory banks 90a and 90b, respectively. Read/write circuits 92a and 92b read data from the addressed memory cells in the memory banks 90a and 90b, respectively, during a read cycle, and write data to the addressed memory cells during a write cycle. A column-address latch-and-decode circuit 94 receives the address from the address register 82 and provides the column address of the selected memory cells to the read/write circuits 92a and 92b. For clarity, the address register 82, the row-address multiplexer 86, the row-address latch-and-decode circuits 88a and 88b, and the column-address latch-and-decode circuit 94 can be collectively referred to as an address decoder.

A data input/output (I/O) circuit 96 includes a plurality of input buffers 98. During a write cycle, the buffers 98 receive and store data from the DATA bus, and the read/write circuits 92a and 92b provide the stored data to the memory banks 90a and 90b, respectively. The data I/O circuit 96 also includes a plurality of output drivers 100. During a read cycle, the read/write circuits 92a and 92b provide data from the memory banks 90a and 90b, respectively, to the drivers 100, which in turn provide this data to the DATA bus.

A refresh counter 102 stores the address of the row of memory cells to be refreshed either during a conventional auto-refresh mode or self-refresh mode. After the row is refreshed, a refresh controller 104 updates the address in the refresh counter 102, typically by either incrementing or decrementing the contents of the refresh counter 102 by one. Although shown separately, the refresh controller 104 may be part of the control logic 84 in other embodiments of the memory device 80.

The memory device 80 may also include an optional charge pump 106, which steps up the power-supply voltage $V_{DD}$ to a voltage $V_{DDP}$. In one embodiment, the pump 106 generates $V_{DDP}$ approximately 1–1.5 V higher than $V_{DD}$. The memory circuit 80 may also use $V_{DDP}$ to conventionally overdrive selected internal transistors.

Figure 6:
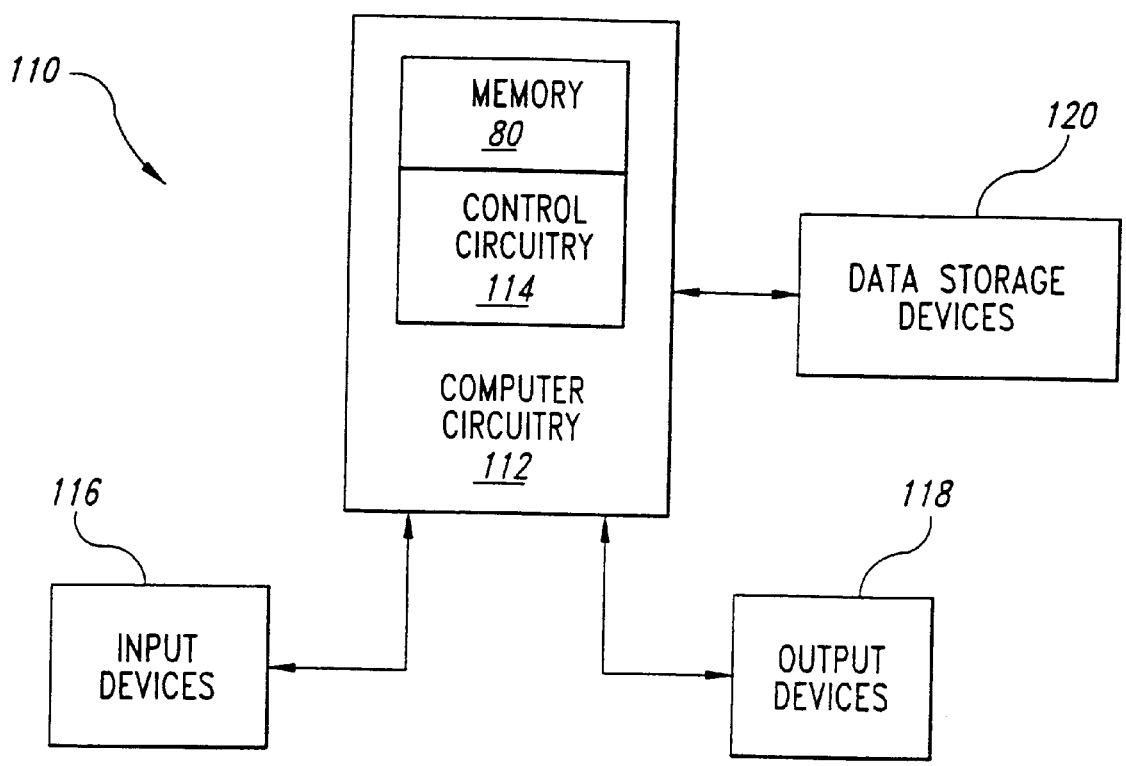
FIG. 6 is a block diagram of a computer system that incorporates the memory circuit of FIG. 5.

FIG. 6 is a block diagram of an electronic system 110, such as a computer system, which incorporates the memory circuit 80 of FIG. 5. The system 110 includes computer circuitry 112 for performing computer functions, such as executing software to perform desired calculations and tasks. The circuitry 112 typically includes a processor 114 and the memory circuit 80, which is coupled to the processor 114. One or more input devices 116, such as a keyboard or a mouse, are coupled to the computer circuitry 112 and allow an operator (not shown) to manually input data thereto. One or more output devices 118 are coupled to the computer circuitry 112 to provide to the operator data generated by the computer circuitry 112. Examples of such output devices 118 include a printer and a video display unit. One or more data-storage devices 120 are coupled to the computer circuitry 112 to store data on or retrieve data from external storage media (not shown). Examples of the storage devices 120 and the corresponding storage media include drives that accept hard and floppy disks; tape cassettes, and compact disk read-only memories (CD-ROMs). Typically, the computer circuitry 112 includes address data and command buses and a clock line that are respectively coupled to the ADDRESS, DATA, and COMMAND buses, and the CLK line of the memory device 80.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An antifuse, comprising:
   a dielectric layer having a first side, a second side that is opposite the first side, and an opening that extends through the dielectric layer;
   a silicon germanium layer that is adjacent to the first side of the dielectric layer; and
   a conductive barrier layer that is adjacent to the second side of the dielectric layer and that contacts the silicon germanium layer through the opening in the dielectric layer.

2. The antifuse of claim 1 wherein the conductive barrier layer comprises tungsten nitride.

3. The antifuse of claim 1 wherein the conductive barrier layer comprises tungsten silicon nitride.

4. The antifuse of claim 1 wherein the conductive barrier layer comprises titanium silicon nitride.

5. The antifuse of claim 1, further comprising:
   an electrode adjacent to a side of the conductive barrier layer opposite the dielectric layer; and
   a silicide layer disposed between the conductive barrier layer and the electrode.

6. An antifuse, comprising:
   a silicon dioxide layer having a first side, a second side that is opposite the first side, and an opening that extends through the silicon dioxide layer;
   a first conductive barrier layer adjacent to the first side of the silicon dioxide layer; and
   a second conductive barrier layer adjacent to the second side of the silicon dioxide layer and that contacts the first conductive barrier layer through the opening in the silicon dioxide layer.

7. The antifuse of claim 6 wherein at least one of the conductive barrier layers is selected from the group consisting titanium nitride, tungsten nitride, tungsten silicon nitride or titanium silicon nitride.

8. The antifuse of claim 6, further comprising:
   an electrode adjacent to a side of at least one of the conductive barrier layers opposite the dielectric layer; and
   a silicide layer disposed between the at least one of the conductive barrier layers and the electrode.

9. An antifuse, comprising:
   a dielectric layer having a first side, a second side that is opposite the first side, and an opening that extends through the dielectric layer;
   a conductive layer that is adjacent to the first side of the dielectric layer; and
   a conductive barrier layer having a thickness of less than approximately 600 angstroms that is adjacent to the second side of the dielectric layer and that contacts the conductive layer through the opening in the dielectric layer.

10. The antifuse of claim 9 wherein the conductive barrier layer comprises tungsten nitride.

11. The antifuse of claim 9 wherein the conductive barrier layer comprises tungsten silicon nitride.

12. The antifuse of claim 9 wherein the conductive barrier layer comprises titanium silicon nitride.

13. The antifuse of claim 9, further comprising:
   an electrode adjacent to a side of the conductive barrier layer opposite the dielectric layer; and
   a silicide layer disposed between the conductive barrier layer and the electrode.

14. An antifuse, comprising:
   a silicon dioxide layer having a first side, a second side that is opposite the first side, and an opening that extends through the silicon dioxide layer;
   a conductive layer that is adjacent to the first side of the silicon dioxide layer; and
   a conductive barrier layer that is adjacent to the second side of the silicon dioxide layer and that contacts the conductive layer through the opening in the silicon dioxide layer.

15. The antifuse of claim 14 wherein the conductive barrier layer comprises tungsten nitride.

16. The antifuse of claim 14 wherein the conductive barrier layer comprises tungsten silicon nitride.

17. The antifuse of claim 14 wherein the conductive barrier layer comprises titanium silicon nitride.

18. The antifuse of claim 14, further comprising:
   an electrode adjacent to a side of the conductive barrier layer opposite the silicon dioxide layer; and
   a silicide layer disposed between the conductive barrier layer and the electrode.

19. An antifuse, comprising:

a tantalum pentaoxide layer having a first side, a second side that is opposite the first side, and an opening that extends through the tantalum pentaoxide layer;

a conductive layer that is adjacent to the first side of the tantalum pentaoxide layer; and a conductive barrier layer that is adjacent to the second side of the tantalum pentaoxide layer and that contacts the conductive layer through the opening in the tantalum pentaoxide layer.

20. The antifuse of claim 19 wherein the conductive barrier layer comprises tungsten nitride.

21. The antifuse of claim 19 wherein the conductive barrier layer comprises tungsten silicon nitride.

22. The antifuse of claim 19 wherein the conductive barrier layer comprises titanium silicon nitride.

23. The antifuse of claim 19, further comprising:

an electrode adjacent to a side of the conductive barrier layer opposite the silicon dioxide layer; and a silicide layer disposed between the conductive barrier layer and the electrode.

* * * * *

UNITED STATES PATENT AND TRADEMARK OFFICE
CERTIFICATE OF CORRECTION

PATENT NO. : 6,392,284 B1
DATED : May 21, 2002
INVENTOR(S) : Randhir P.S. Thakur, Garry A. Mercaldi and Michael Nuttall It is certified that error appears in the above-identified patent and that said Letters Patent is hereby corrected as shown below:

<u>Title page,</u>
Item [75], Inventors, reads "Randhir P.S. Thakur, Boise, CA (US)" should read
-- Randhir P.S. Thakur, Cupertino, CA (India) --

Item [56], References Cited, please add the following references:

| | | | |
|---|---|---|---|
| 6,096,630 | 8/1/00 | Byun et al. | 438/592 |
| 6,140,173 | 10/31/00 | Wolters et al. | 438/240 |
| 6,162,741 | 12/19/00 | Akasaka et al. | 438/773 |
| 6,261,720 B1 | 6/26/01 | Thakur et al. | 438/240 |
| 6,291,868 B1 | 9/18/01 | Weimer et al. | 257/413 |

Signed and Sealed this

Twenty-sixth Day of November, 2002

*Attest:*

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO.    : 6,392,284 B1
DATED         : May 21, 2002
INVENTOR(S)   : Randhir P.S. Thakur, Garry A. Mercaldi and Michael Nuttall It is certified that error appears in the above-identified patent and that said Letters Patent is hereby corrected as shown below:

<u>Title page,</u>
Item [75], Inventors, reads "Randhir P.S. Thakur, Boise, CA (US)" should read
-- Randhir P.S. Thakur, Cupertino, CA (India) --

Item [56], References Cited, please add the following references:

| | | | |
|---|---|---|---|
| 6,096,630    | 8/1/00   | Byun et al.    | 438/592 |
| 6,140,173    | 10/31/00 | Wolters et al. | 438/240 |
| 6,162,741    | 12/19/00 | Akasaka et al. | 438/773 |
| 6,251,720 B1 | 6/26/01  | Thakur et al.  | 438/240 |
| 6,291,868 B1 | 9/18/01  | Weimer et al.  | 257/413 |

This certificate supersedes Certificate of Correction issued November 26, 2002.

Signed and Sealed this

Sixth Day of May, 2003

JAMES E. ROGAN
*Director of the United States Patent and Trademark Office*